US 6,632,735 B2

(12) United States Patent
Yau et al.

(10) Patent No.: US 6,632,735 B2
(45) Date of Patent: Oct. 14, 2003

(54) METHOD OF DEPOSITING LOW DIELECTRIC CONSTANT CARBON DOPED SILICON OXIDE

(75) Inventors: Wai-Fan Yau, Los Altos, CA (US); Ju-Hyung Lee, Campbell, CA (US); Nasreen Gazala Chopra, Belmont, CA (US); Tzu-Fang Huang, San Jose, CA (US); David Cheung, Foster City, CA (US); Farhad Moghadam, Saratoga, CA (US); Kuo-Wei Liu, San Jose, CA (US); Yung-Cheng Lu, Taipei (TW); Ralf B. Willecke, Santa Clara, CA (US); Paul Matthews, San Jose, CA (US); Dian Sugiarto, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 09/924,240

(22) Filed: Aug. 7, 2001

(65) Prior Publication Data

US 2003/0032305 A1 Feb. 13, 2003

(51) Int. Cl.$^7$ .................................. H01L 21/31
(52) U.S. Cl. .................... 438/623; 438/783; 438/637; 438/624; 438/788; 438/763; 438/795; 438/638; 438/789; 438/780
(58) Field of Search ........................ 438/783, 623, 438/637, 624, 788, 763, 795, 638, 789, 780

(56) References Cited

U.S. PATENT DOCUMENTS

| | | | |
|---|---|---|---|
| 5,789,325 A | 8/1998 | Chandra et al. | 438/781 |
| 6,054,206 A | 4/2000 | Mountsier | 428/312.8 |
| 6,054,379 A * | 4/2000 | Yau et al. | 438/623 |
| 6,068,884 A | 5/2000 | Rose et al. | 427/255.6 |
| 6,114,259 A | 9/2000 | Sukharev et al. | 438/789 |
| 6,147,009 A | 11/2000 | Grill et al. | 438/780 |
| 6,159,871 A | 12/2000 | Loboda et al. | 438/786 |
| 6,238,751 B1 | 5/2001 | Mountsier | 427/574 |
| 6,316,063 B1 * | 11/2001 | Andideh et al. | 427/577 |
| 6,346,488 B1 * | 2/2002 | Kabansky | 438/783 |
| 6,346,490 B1 * | 2/2002 | Catabay et al. | 438/795 |
| 6,348,421 B1 * | 2/2002 | Shu et al. | 438/788 |
| 6,391,795 B1 * | 5/2002 | Catabay et al. | 438/763 |
| 6,407,013 B1 * | 6/2002 | Li et al. | 438/788 |
| 6,410,462 B1 * | 6/2002 | Yang et al. | 438/788 |
| 6,410,770 B2 * | 6/2002 | Arkles et al. | 556/466 |
| 6,417,092 B1 * | 7/2002 | Jain et al. | 438/624 |
| 6,455,417 B1 * | 9/2002 | Bao et al. | 438/637 |
| 6,489,030 B1 * | 12/2002 | Wu et al. | 428/447 |
| 2002/0098684 A1 | 7/2002 | Li et al. | 438/630 |
| 2002/0105084 A1 | 8/2002 | Li | 257/759 |
| 2002/0132494 A1 | 9/2002 | Hsieh | 438/778 |
| 2002/0164868 A1 | 11/2002 | Chang et al. | 438/622 |
| 2002/0177329 A1 | 11/2002 | Yang et al. | 438/798 |

FOREIGN PATENT DOCUMENTS

| | | | | |
|---|---|---|---|---|
| EP | 1 037 275 A1 | 9/2000 | | H01L/21/768 |
| WO | WO 01/01472 A1 | 1/2001 | | H01L/21/312 |

* cited by examiner

Primary Examiner—Matthew Smith
Assistant Examiner—V. Yevsikov
(74) Attorney, Agent, or Firm—Moser, Patterson & Sheridan, L.L.P.

(57) ABSTRACT

A method of forming a carbon-doped silicon oxide layer is disclosed. The carbon-doped silicon oxide layer is formed by applying an electric field to a gas mixture comprising an organosilane compound and an oxidizing gas. The carbon-doped silicon oxide layer is compatible with integrated circuit fabrication processes. In one integrated circuit fabrication process, the carbon-doped silicon oxide layer is used as an intermetal dielectric layer. In another integrated circuit fabrication process, the carbon-doped silicon oxide layer is incorporated into a damascene structure.

13 Claims, 4 Drawing Sheets

METHOD OF DEPOSITING LOW DIELECTRIC CONSTANT CARBON DOPED SILICON OXIDE

BACKGROUND OF THE DISCLOSURE

1. Field of the Invention

The present invention relates to silicon oxide layers, their use in integrated circuit fabrication, and a method for forming a carbon doped silicon oxide layer.

2. Description of the Background Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g., sub-micron dimensions), the materials used to fabricate such components contribute to their electrical performance. For example, low resistivity metal interconnects (e.g., copper and aluminum) provide conductive paths between the components on integrated circuits. Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g., dielectric constants less than about 4.5) are needed.

Therefore, a need exists in the art for low dielectric constant materials suitable for integrated circuit fabrication.

SUMMARY OF THE INVENTION

A method of forming a carbon-doped silicon oxide layer for use in integrated circuit fabrication is provided. In one embodiment, the carbon-doped silicon oxide layer is formed by applying an electric field to a gas mixture comprising an organosilane compound and an oxidizing gas.

The carbon-doped silicon oxide layer is compatible with integrated circuit fabrication processes. In one integrated circuit fabrication process, the carbon-doped silicon oxide layer is used as an intermetal dielectric layer. For such an embodiment, a preferred process sequence includes depositing the carbon-doped silicon oxide layer over conductive leads formed on a substrate.

In another integrated circuit fabrication process, the carbon-doped silicon oxide layer is incorporated into a damascene structure. For such an embodiment, a preferred process sequence includes depositing a first dielectric layer on a substrate. A carbon-doped silicon oxide layer is then formed on the first dielectric layer. Thereafter, the carbon-doped silicon oxide layer is patterned and etched to define contacts/vias therethrough. After the carbon-doped silicon oxide layer is patterned and etched, a second dielectric layer is deposited thereover. The second dielectric layer is then patterned and etched to define interconnects therethrough. The interconnects formed in the second dielectric layer are positioned over the contacts/vias formed in the carbon-doped silicon oxide layer. After the interconnects are formed the contacts/vias defined in the carbon-doped silicon oxide layer are etched through the first dielectric layer to the substrate surface. Thereafter, the damascene structure is completed by filling the interconnects and contacts/vias with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
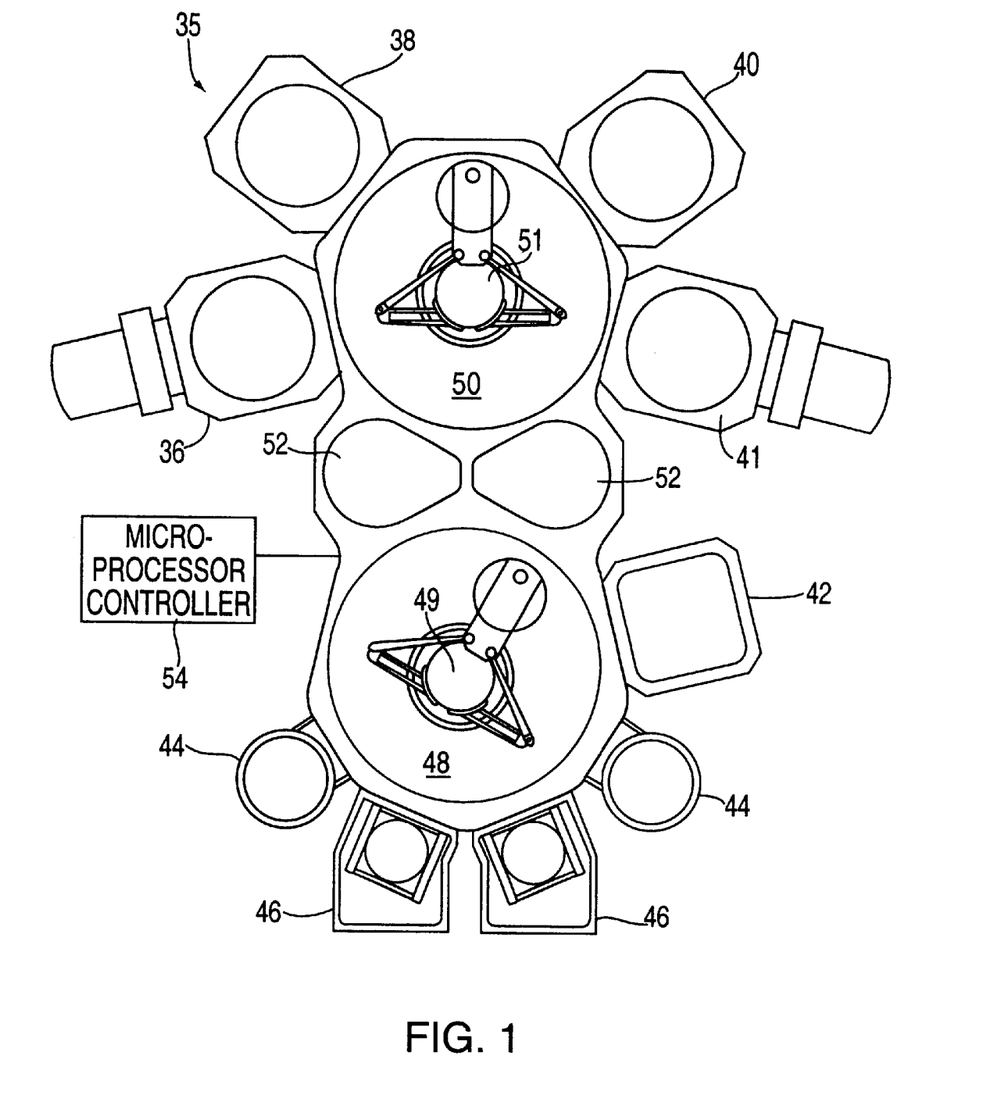
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. This apparatus typically comprises process chambers 36, 38, 40, 41, load-lock chambers 46, a transfer chamber 50, a microprocessor controller 54, along with other hardware components such as power supplies (not shown) and vacuum pumps (not shown). An example of such a wafer processing system 35 is a CENTURA® System, commercially available from Applied Materials, Inc., Santa Clara, Calif.

Details of the wafer processing system are described in commonly assigned U.S. Pat. No. 5,186,718, entitled, "Staged-Vacuum Substrate Processing System and Method", issued on Feb. 16, 1993, and is hereby incorporated by reference. The salient features of this system 35 are briefly described below.

The wafer processing system 35 includes a transfer chamber 50, containing a transfer robot 51. The transfer chamber 50 is coupled to load-lock chambers 46 as well as a cluster of process chambers 36, 38, 40, 41.

Substrates (not shown) are loaded into the wafer processing system 35 through load-lock chambers 46. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, ionized metal plasma physical vapor deposition (IMP PVD) chambers, chemical vapor deposition (CVD) chambers, rapid thermal process (RTP) chambers, and anti-reflective coating (ARC) chambers, among others.

Figure 2:
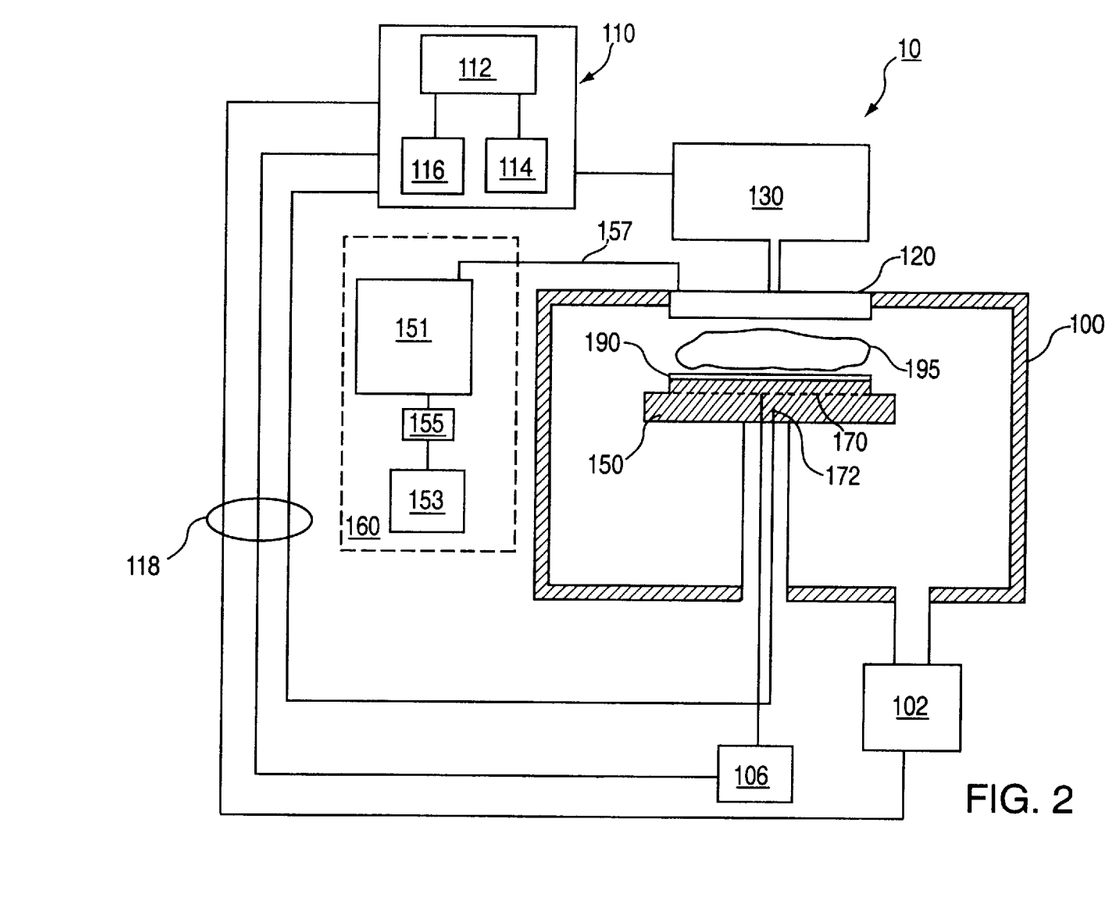
FIG. 2 depicts a schematic cross-sectional view of a chemical vapor deposition (CVD) chamber.

FIG. 2 depicts a schematic cross-sectional view of a chemical vapor deposition (CVD) process chamber 36 of wafer processing system 35. CVD process chamber 36 may be used to deposit carbon-doped silicon oxide layers in accordance with embodiments described herein. An example of such a CVD process chamber 36 is a DXZ™ chamber, commercially available from Applied Materials, Inc., Santa Clara, Calif.

CVD process chamber 36 typically comprises a gas panel 130, a control unit 110, along with other hardware components such as power supplies and vacuum pumps. Details of the CVD process chamber 36 are described in commonly assigned U.S. patent application Ser. No. 09/211,998, entitled "High Temperature Chemical Vapor Deposition Chamber", filed on Dec. 14, 1998, and is herein incorporated by reference. The salient features of the CVD process chamber 36 are briefly described below.

The CVD process chamber 36 generally houses a support pedestal 150, which is used to support a substrate such as a semiconductor wafer 190. This pedestal 150 can typically be moved in a vertical direction inside the chamber 36 using a displacement mechanism (not shown). Depending on the specific process, the wafer 190 can be heated to some desired temperature prior to layer deposition. For example, the wafer support pedestal 150 is heated by an embedded heater element 170. The pedestal 150 may be resistively heated by applying an electric current from an AC supply 106 to the heater element 170. The wafer 190 is, in turn, heated by the pedestal 150. A temperature sensor 172, such as a thermocouple, is also embedded in the wafer support pedestal 150 to monitor the temperature of the pedestal 150 in a conventional manner. The measured temperature is used in a feedback loop to control the power supplied to the heating element 170, such that the wafer temperature can be maintained or controlled at a desired temperature which is suitable for the particular process application. The pedestal 150 is optionally heated using a plasma or by radiant heat (not shown).

A vacuum pump 102, is used to evacuate the process chamber 36 and to maintain the proper gas flows and pressure inside the chamber 36. A showerhead 120, through which process gases are introduced into the chamber 36, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 36 are ignited into a plasma. Typically, the electric field is generated by connecting the wafer support pedestal 150 to a source of RF power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In at least one embodiment, carbon-doped silicon oxide layer deposition is accomplished by plasma enhanced oxidation of a organosilane compound, such as trimethyl silane. The organosilane compound is introduced into the process chamber 36 under the control of gas panel 130 as a gas with a regulated flow.

Proper control and regulation of the gas flows through the gas panel 130 is performed by mass flow controllers (not shown) and a computer (not shown). The showerhead 120 allows process gases from the gas panel 130 to be uniformly introduced and distributed in the process chamber 100.

Referring to FIG. 1, the CVD process chamber 36 is controlled by a microprocessor controller 54. The microprocessor controller 54 may be one of any form of general purpose computer processor (CPU) that can be used in an industrial setting for controlling various chambers and sub-processors. The computer may include any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routine, when executed, transforms the general purpose computer into a specific process computer that controls the chamber operation so that a chamber process is performed. Alternatively, the process of the present invention may be performed in hardware, as an application specific integrated circuit or other type of hardware implementation, or a combination of software or hardware.

Carbon-Doped Silicon Oxide Layer Deposition

In one embodiment, the carbon-doped silicon oxide layer is formed by applying an electric field to a gas mixture comprising an organosilane compound and an oxidizing gas. The organosilane compound has the general formula $Si_aC_b$-$H_cO_d$ where a has a range between 1 and 2, b has a range between 1 and 10, c has a range between 6 and 30, and d has a range between 0 and 6.

For example, methylsilane ($SiCH_6$), dimethylsilane ($SiC_2H_8$), trimethylsilane ($SiC_3H_{10}$), tetramethylsilane ($SiC_4H_{12}$), methoxysilane ($SiCH_6O$), dimethyldimethoxysilane ($SiC_4H_{12}O_2$), diethyldiethoxysilane ($SiC_8H_{20}O_2$), dimethyldiethoxysilane ($SiC_6H_{16}O_2$), diethyldimethoxysilane ($SiC_6H_{16}O_2$), hexamethyldisiloxane ($Si_2C_6H_{18}O$), bis(methylsilano)methane ($Si_2C_3H_{12}$), 1,2-bis(methylsilano) ethane ($Si_2C_4H_{14}$), among others may be used as the organosilane compound.

Oxygen ($O_2$), ozone ($O_3$), nitrous oxide ($N_2O$), carbon monoxide (CO), carbon dioxide ($CO_2$), or combinations thereof, among others, may be used as the oxidizing gas. The oxidizing gas may be diluted with an inert gas such as nitrogen ($N_2$), helium (He), and argon (Ar).

In general, the following deposition process parameters can be used to form the carbon-doped silicon oxide layer using a CVD process chamber similar to that shown in FIG. 2. The process parameters range from a wafer temperature of about 50° C. to about 500 ° C., a chamber pressure of about 1 torr to about 500 torr, an organosilane compound gas flow rate of about 50 sccm to about 1000 sccm, an oxidizing gas flow rate of about 10 sccm to about 1000 sccm, and an RF power of between about 1 watts/cm$^2$ to about 500 watts/cm$^2$. The above process parameters provide a deposition rate for the carbon-doped silicon oxide layer in the range of about 0.1 micron/min to about 2 micron/min when implemented on a 200 mm (millimeter) substrate in a deposition chamber available from Applied Materials, Inc.

Other deposition chambers are within the scope of the invention, and the parameters listed above may vary according to the particular deposition chamber used to form the carbon-doped silicon oxide layer. For example, other deposition chambers may have a larger (e. g., configured to accommodate 300 mm substrates) or smaller volume, requiring gas flow rates that are larger or smaller than those recited for deposition chambers available from Applied Materials, Inc.

After the carbon-doped silicon oxide layer is formed, it is optionally annealed. Nitrogen ($N_2$), hydrogen ($H_2$), oxygen ($O_2$), or combinations thereof, among others, may be used as the annealing gas. It is believed that the annealing step minimizes the water vapor absorption capability of the as deposited carbon-doped silicon oxide layer, improving the dielectric properties thereof.

In general, the following process parameters may be used to anneal the carbon-doped silicon oxide layer in a process chamber similar to that shown in FIG. 2. The process parameters range from a wafer temperature of about 200° C. to about 500° C. and an annealing gas flow rate of about 1000 sccm to about 10,000 sccm. The carbon-doped silicon oxide layer is annealed for less than about 30 minutes.

The as-deposited carbon-doped silicon oxide layer has a dielectric constant that is less than about 3.0, making it suitable for use as an insulating material in integrated circuits. The dielectric constant of the carbon-doped silicon oxide layer is tunable, in that it can be varied in a range between about 2.0 to about 3.0 as a function of the reaction temperature. In particular, as the reaction temperature increases, the dielectric constant of the as-deposited layer decreases.

The dielectric constant of the carbon-doped silicon oxide layer can also be tuned as a function of the composition of the gas mixture during layer formation. As the carbon (C) concentration in the gas mixture increases, the C content of the as-deposited carbon-doped silicon oxide layer increases, decreasing its dielectric constant. The carbon content of the as deposited silicon oxide layer preferably is less than about 10%.

Integrated Circuit Fabrication Processes

A. Carbon-Doped Silicon Oxide Intermetal Dielectric Layer

Figure 3A:
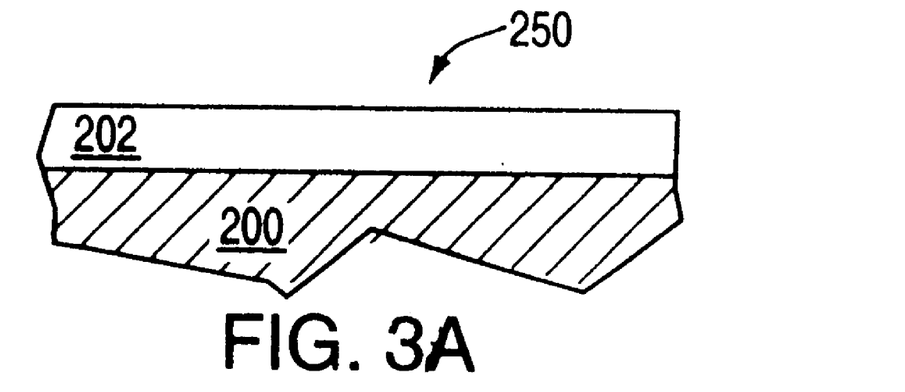
FIGS. 3a–3b depict schematic cross-sectional views of a substrate at different stages of integrated circuit fabrication incorporating a carbon-doped silicon oxide layer as an intermetal dielectric layer.
Figure 3B:
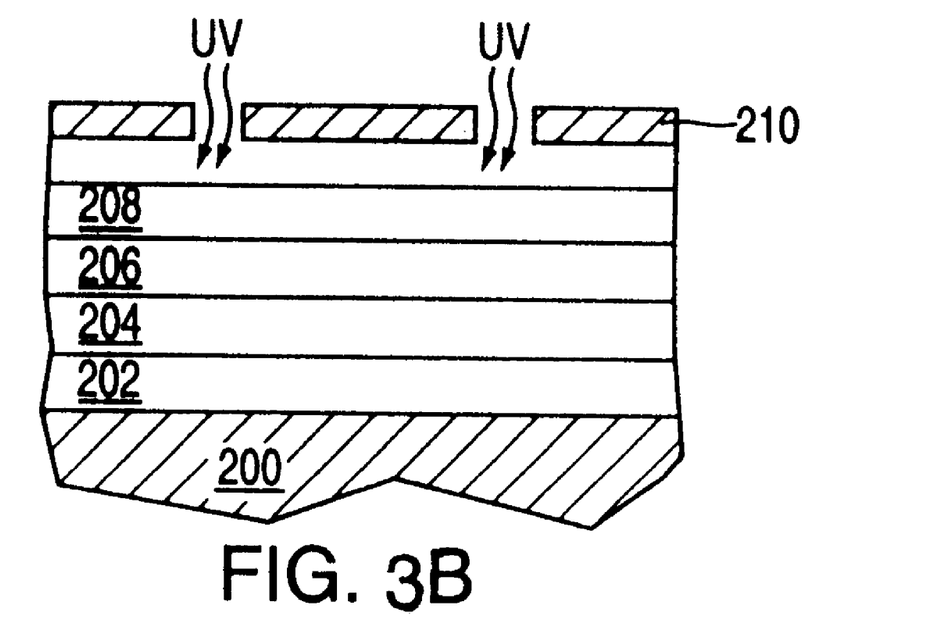

FIGS. 3a–3b illustrate schematic cross-sectional views of a substrate 200 at different stages of an integrated circuit fabrication sequence incorporating a carbon-doped silicon oxide layer as an intermetal dielectric layer. In general, the substrate 200 refers to any workpiece on which film processing is performed. Depending on the specific stage of processing, the substrate 200 may correspond to a silicon wafer, or other material layers, which have been formed on the substrate. FIG. 3a, for example, illustrates a cross-sectional view of a substrate structure 250 in which the substrate 200 is a silicon wafer with conductive leads 204 formed thereon. The conductive leads may be formed of a metal (e.g. copper, aluminum, tungsten).

The conductive leads 204 have various cross-sectional geometries such as, for example, square, rectangular, and circular. The conductive leads typically have aspect ratios of greater than about 1:4. The aspect ratio is defined as the lead height divided by its width.

FIG. 3b depicts a carbon-doped silicon oxide layer 206 formed on the substrate structure 250 according to the process parameters described above. The thickness of the carbon-doped silicon oxide layer 206 is variable depending upon the specific stage of processing. Typically the carbon-doped silicon oxide layer 206 is deposited to a thickness of about 500 Å to about 10000 Å.

After the carbon-doped silicon oxide layer 206 is formed on the substrate structure 250, the carbon-doped silicon oxide layer is optionally annealed. The carbon-doped silicon oxide layer 206 is annealed according to the process parameters described above.

B. Damascene Structure Incorporating a Carbon-Doped Silicon Oxide Layer

Figure 4A:
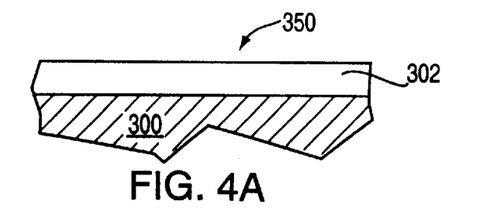
FIGS. 4a–4e depict schematic cross-sectional views of a damascene structure at different stages of integrated circuit fabrication incorporating a carbon-doped silicon oxide layer in such structure.

FIGS. 4a–4e illustrate schematic cross-sectional views of a substrate 300 at different stages of a damascene structure fabrication sequence incorporating an carbon-doped silicon oxide layer therein. Damascene structures are typically used to form metal interconnects on integrated circuits. Depending on the specific stage of processing, substrate 300 may correspond to a silicon substrate, or other material layer that has been formed on the substrate 300. FIG. 4a, for example, illustrates a cross-sectional view of a substrate 300 having conductive leads 301, intermetal dielectric 303, a barrier layer 305, as well as a first dielectric layer 302 formed thereon. The conductive leads 301 may be a metal (e. g., aluminum, copper). The intermetal dielectric 303 and the barrier layer 305 may be a low dielectric constant material (e.g., organosilicate material, silicon carbide). The first dielectric layer 302 may be an oxide (e.g., fluorosilicate glass). In general, the substrate 300 may include a layer of silicon, silicides, metals, or other materials.

FIG. 4a illustrates one embodiment in which the substrate 300 is silicon, the conductive leads 301 are copper, and the intermetal dielectric 303 is a silicon oxide. The barrier layer 305 is typically a silicon carbide layer suitable to minimize the diffusion of metal from the conductive leads into the first dielectric layer 302. The barrier layer 305 has a thickness of about 200 Å to about 1000 Å, depending on its dielectric constant as well as its etch selectivity with respect to the overlying dielectric material (e.g., the barrier layer preferably has an etch selectivity with respect to the overlying dielectric layer that is greater than about 10:1). The first dielectric layer 302 has a thickness of about 1,000 Å to about 10,000 Å, depending on the size of the structure to be fabricated.

An carbon-doped silicon oxide layer 304 is formed on the first dielectric layer 302. The carbon-doped silicon oxide layer 304 is formed on the first dielectric layer 302 according to the process parameters described above. The carbon-doped silicon oxide layer 304 has a dielectric constant less than 3.0, so as to prevent or minimize capacitive coupling between the metal interconnects to be formed in the damascene structure. The dielectric constant for the carbon-doped silicon oxide layer 304 is tunable, in that it can be varied in the desired range as a function of the reaction temperature as well as the composition of the gas mixture during layer formation.

The thickness of the carbon-doped silicon oxide layer 304 is variable depending on the specific stage of processing. Typically, the carbon-doped silicon oxide layer 304 has a thickness of about 200 Å to about 1000 Å, depending on its dielectric constant as well as its etch selectivity with respect to an overlying dielectric material subsequently formed thereon (e.g., the barrier layer preferably has an etch selectivity with respect to the overlying dielectric layer that is greater than about 10:1).

Figure 4B:
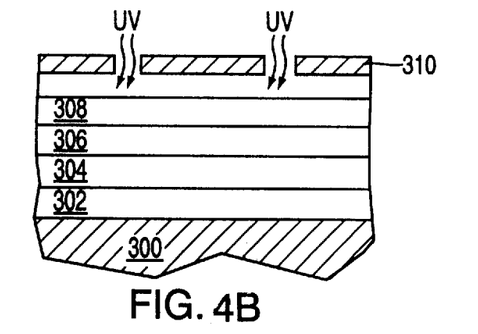

Referring to FIG. 4b, the carbon-doped silicon oxide layer 304 is patterned and etched to define contact/via openings 306 and to expose the first dielectric layer 302, in areas where the contacts/vias are to be formed. The contact/via openings are positioned over the conductive leads 301.

The carbon-doped silicon oxide layer 304 may be patterned using conventional lithography process. For example, in a conventional lithography process, a layer of energy sensitive resist material (not shown) is formed on the carbon-doped silicon oxide layer 304. The layer of energy sensitive resist material can be spin coated on the substrate to a thickness within a range of about 4000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 245 nm.

An image of a pattern is introduced into the layer of energy sensitive resist material by exposing such energy sensitive resist material to UV radiation via a mask (not shown). The image of the pattern introduced in the layer of the energy sensitive resist material is developed in an appropriate developer to define the pattern therethrough. Thereafter referring to FIG. 4b, the pattern defined in the energy sensitive resist material is transferred through the carbon-doped silicon oxide layer 304.

The pattern is transferred through the carbon-doped silicon oxide layer 304 using the energy sensitive resist material (not shown) as a mask. The pattern is transferred through the carbon-doped silicon oxide layer 304 using an appropriate chemical etchant. For example, carbon tetrafluoride ($CF_4$) fluoroethane ($C_2F_6$), and fluorobutene ($C_4F_8$) may be used to chemically etch the organosilicate layer 304.

Figure 4C:
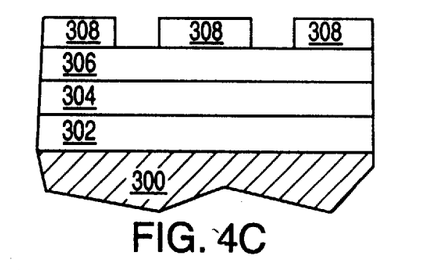

After the carbon-doped silicon oxide layer 304 is patterned, a second dielectric layer 308 is deposited over the carbon-doped silicon oxide layer 304, as shown in FIG. 4c. The second dielectric layer 308 may be an oxide (e.g., fluorosilicate glass). The second dielectric layer 308 has a thickness of about 1,000 Å to about 10,000 Å, depending on the size of the structure to be fabricated.

Figure 4D:
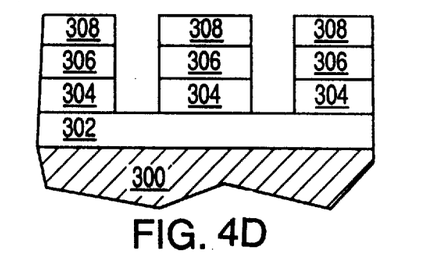

The second dielectric layer 308 is then patterned to define interconnects as illustrated in FIG. 4d, preferably using conventional lithography processes as described above. The interconnects formed in the second dielectric layer 308 are positioned over the contact/via openings 306 in the carbon-doped silicon oxide layer 304. Thereafter, both the interconnects 310 and contacts/vias 306 are etched to expose the surface of the conductive leads 301, using reactive ion etching or other anisotropic etching techniques.

Figure 4E:
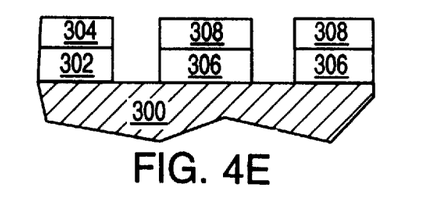

Referring to FIG. 4e, the interconnects and contacts/vias 306 are filled with a conductive material (not shown) such as aluminum, copper, tungsten, or combinations thereof. Typically, copper is used to fill the interconnects and contacts/vias 306 due to its low resistivity (resistivity about 1.7 $\mu\Omega$-cm). The conductive material is deposited using chemical vapor deposition, physical vapor deposition, electroplating, or combinations thereof, to form the damascene structure. Preferably, a barrier layer such as tantalum, tantalum nitride, or other suitable barrier material is first deposited conformably on the sidewalls of the interconnects and contacts/vias to prevent metal migration into the surrounding dielectric layers 302, 308 as well as the carbon-doped silicon oxide layer 304.

Although several preferred embodiments, which incorporate the teachings of the present invention, have been shown and described in detail, those skilled in the art can readily devise many other varied embodiments that still incorporate these of metal layers used in integrated circuits.

What is claimed is:

1. A method of thin film deposition, comprising:
    positioning a substrate in a deposition chamber;
    providing a gas mixture to the deposition chamber, wherein the gas mixture comprises methozysilane ($SiCH_6O$) and an oxidizing gas;
    applying an electric field to the gas mixture in the deposition chamber to form a carbon-doped silicon oxide layer on the substrate wherein the carbon content of the carbon-doped silicon oxide layer is less than about 10%; and
    annealing the carbon-doped silicon oxide layer in an atmosphere comprising one or more gases selected from the group of nitrogen ($N_2$), Hydorgen ($H_2$), and oxygen ($O_2$).

2. The method of claim 1 wherein the oxidizing gas is selected from the group of nitrous oxide ($N_2O$), oxygen ($O_2$), ozone ($O_3$), carbon monoxide (CO), carbon dioxide ($CO_2$), and combinations thereof.

3. The method of claim 1 wherein the electric field applied to the gas mixture in the deposition chamber is a radio frequency (RF) power.

4. The method of claim 3 wherein the RF power is within the range of about 1 watts/cm$^2$ to about 500 watts/cm$^2$.

5. The method of claim 1 wherein the deposition chamber is maintained at a pressure between about 1 torr to about 500 torr.

6. The method of claim 1 wherein the methoxysilane ($SiCH_6O$) is provided to the deposition chamber at a flow rate in a range of about 50 sccm to about 1000 sccm.

7. The method of claim 1 wherein the oxidizing gas is provided to the deposition chamber at a flow rate in a range of about 10 sccm to about 1000 sccm.

8. The method of claim 1 wherein the ratio of the oxidizing gas to the methoxysilane ($SiCH_6O$) is about 1:1 to about 1:5.

9. The method of claim 1 wherein the deposition chamber is maintained at a temperature between about 50° C. to about 500° C.

10. The method of claim 1 wherein the annealing is performed at a temperature between about 200° C. to about 500° C.

11. A computer storage medium containing a software routine that, when executed, causes a general purpose computer to control a deposition chamber using a layer deposition method, comprising:
    positioning a substrate in a deposition chamber;
    providing a gas mixture to the deposition chamber, wherein the gas mixture comprises methoxysilane ($SiCH_6O$) and an oxidizing gas;
    applying an electric field to the gas mixture in the deposition chamber to form a carbon-doped silicon oxide layer on the substrate wherein the carbon content of the carbon-doped silicon oxide layer is less than about 10%; and
    annealing the carbon-doped silicon oxide layer in an atmosphere comprising one or more gases selected from the group of nitrogen ($N_2$), hydrogen ($H_2$), and oxygen ($O_2$).

12. A method of forming a device, comprising:
    providing a substrate having conductive features formed thereon; forming a a carbon-doped silicon oxide layer on the substrate wherein the carbon content of the carbon-doped silicon oxide layer is less than about 10%, and wherein the carbon-doped silicon oxide layer is formed by applying an electric field to a gas mixture comprising methoxysilane ($SiCH_6O$) and an oxidizing gas; and
    annealing the carbon-doped silicon oxide layer in an atmosphere comprising one or more gases selected from the group of nitrogen ($N_2$), hydrogen ($H_2$), and oxygen ($O_2$).

13. A method of fabricating a damascene structure, comprising forming a first dielectric layer on a substrate;

forming a a carbon-doped silicon oxide layer on the substrate wherein the carbon content of the carbon-doped silicon oxide layer is less than about 10%, wherein the carbon-doped silicon oxide layer is formed by applying an electric field to a gas mixture comprising methoxysilane ($SiCH_6O$) and an oxidizing gas;

annealing the carbon-doped silicon oxide layer in an atmosphere comprising one or more gases selected from the group of nitrogen ($N_2$), hydrogen ($H_2$), and oxygen ($O_2$);

patterning the carbon-doped silicon oxide layer to define contacts/vias therethrough;

forming a second dielectric layer on the patterned carbon-doped silicon oxide layer;

patterning the second dielectric layer to define interconnects therethrough, wherein the interconnects are positioned over the contacts/vias defined in the carbon-doped silicon oxide layer;

etching the first dielectric layer to form contacts/vias therethrough; and filling the contacts/vias and the interconnects with a conductive material.

* * * * *

UNITED STATES PATENT AND TRADEMARK OFFICE
CERTIFICATE OF CORRECTION

PATENT NO.     : 6,632,735 B2
DATED          : October 14, 2003
INVENTOR(S)    : Yau et al.

It is certified that error appears in the above-identified patent and that said Letters Patent is hereby corrected as shown below:

<u>Column 7,</u>
Line 61, "methozysilane" to -- methoxysilane --.

Signed and Sealed this

Thirtieth Day of March, 2004

JON W. DUDAS
*Acting Director of the United States Patent and Trademark Office*